United States Patent
Hshieh (10) Patent No.: US 7,750,398 B2
(45) Date of Patent: Jul. 6, 2010

(54) TRENCH MOSFET WITH TRENCH TERMINATION AND MANUFACTURE THEREOF

(75) Inventor: Fwu-Iuan Hshieh, Shanghai (CN)

(73) Assignee: Force-MOS Technology Corporation, Xu Hui District, Shanghai (CN)

( * ) Notice: Subject to any disclaimer, the term of this patent is extended or adjusted under 35 U.S.C. 154(b) by 295 days.

(21) Appl. No.: 11/862,064

(22) Filed: Sep. 26, 2007

(65) Prior Publication Data

US 2009/0057756 A1  Mar. 5, 2009

Related U.S. Application Data

(60) Provisional application No. 60/847,198, filed on Sep. 26, 2006.

(51) Int. Cl.
    *H01L 23/62* (2006.01)
(52) U.S. Cl. .................. 257/330; 257/E29.257
(58) Field of Classification Search ............ 257/328, 257/329, 330, 331, 491, E29.201, E29.257, 257/E29.26

See application file for complete search history.

(56) References Cited

U.S. PATENT DOCUMENTS

| 6,309,929 | B1 * | 10/2001 | Hsu et al. ............ 438/270 |
| 6,396,090 | B1 * | 5/2002 | Hsu et al. ............ 257/242 |
| 6,441,454 | B2 * | 8/2002 | Hijzen et al. .......... 257/483 |
| 6,621,107 | B2 * | 9/2003 | Blanchard et al. ..... 257/155 |
| 6,855,986 | B2 * | 2/2005 | Hsieh et al. .......... 257/339 |
| 2004/0108554 | A1 * | 6/2004 | Hshieh et al. ........ 257/376 |
| 2004/0113203 | A1 * | 6/2004 | Hshieh et al. ........ 257/330 |
| 2005/0142713 | A1 * | 6/2005 | Fujishima et al. ..... 438/197 |
| 2006/0273382 | A1 * | 12/2006 | Hshieh ............... 257/330 |

* cited by examiner

*Primary Examiner*—Minh-Loan T Tran
*Assistant Examiner*—Vongsavanh Sengdara
(74) *Attorney, Agent, or Firm*—WPAT, P.C.; Anthony King (57) ABSTRACT

A trench MOSFET (Metal-Oxide-Semiconductor Field Effect Transistor) with a trench termination, including a substrate including a drain region which is strongly doped and a doping epi layer region, which is weekly doped the same type as the drain region, on the drain region; a plurality of source and body regions formed in the epi layer; a metal layer including a plurality of metal layer regions which are connected to respective source and body, and gate regions forming metal connections of the MOSFET; a plurality of metal contact plugs connected to respective metal layer regions; a plurality of gate trenches filled with polysilicon to form a plurality of trenched gates on top of epi layer; an insulating layer deposited on the epi layer formed underneath the metal layer with a plurality of metal contact holes therein for contacting respective source and body regions; a margin terminating gate trench which is around the gate trenches; and a margin terminating active region which is formed underneath the margin terminating gate trench.

5 Claims, 7 Drawing Sheets

Fig. 5

TRENCH MOSFET WITH TRENCH TERMINATION AND MANUFACTURE THEREOF

CROSS REFERENCE

The present application claims the priority of U.S. provisional patent application No. 60/847,198, which was filed on Sep. 26, 2006.

BACKGROUND OF THE INVENTION

1. Field of the Invention

The present invention relates to a trenched MOSFET structure with a trench termination and the method for manufacturing thereof, and more particularly to a structure of a trenched MOSFET which is suitable for high cell density and can improve the device ruggedness.

2. The Prior Arts

In the structure of a trench Metal-Oxide-Semiconductor Field Effect Transistor (MOSFET) or vertical transistor, the gate of the transistor is formed in a trench on top of a substrate and the source/drain regions are formed on both sides of the gate. This type of vertical transistor allows high current to pass through and channel to be turned on/off at a low voltage.

Figure 1:
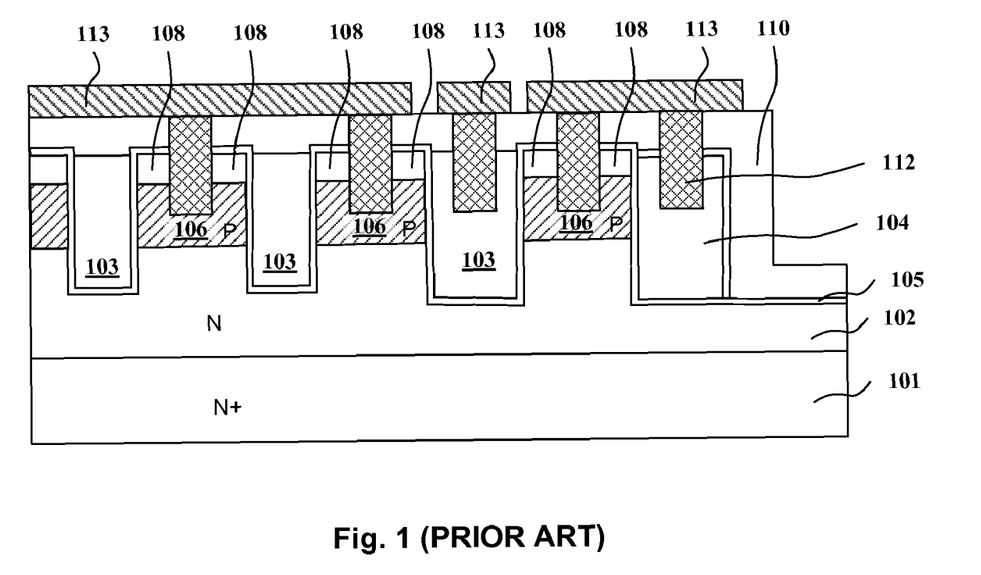
FIG. 1 is a cross-sectional diagram depicting a trenched MOSFET structure with a guard ring.

Referring to FIG. 1, a cross-sectional diagram of the structure of a trenched MOSFET is shown. In the prior art, the trench MOSFET has a MOSFET structure comprises a drain region 101, a N-type doping epi layer region 102, a plurality of gate trenches 103, a margin terminating gate trench 104, a gate oxide layer 105, a plurality of channel regions 106, a plurality of source regions 108, a insulating layer 110, a plurality of contact plugs 112, and a metal layer 113. The metal layer 113 is formed on the top of the MOSFET structure for the source metal and the gate and field plate metal of the MOSFET. The gate trenches 103 are covered the gate oxide layer 105 and are defined as the gate of the MOSFET. The insulating layer 110 is formed between the metal layer 113 and the gate trenches 103 for insulating, and the contact plugs 112 are penetrated through the insulating layer 110 and contacted with the metal layer 113.

In the related prior arts, the device structure is achieved with P body formation prior to trench etch, which is not suitable for high cell density with pitch smaller than 2.4 μm. When cell density increases, more trench openings, causes more boron segregation in P body from channel region near by trench during Sacrificial and gate oxidations, resulting in serious punch-through issue. Besides, separation of gate and field plate metal makes longer termination.

The present invention provides a new structure of trenched MOSFET structure with a trench termination around the contacted trenched gate which improves the lack of the prior art.

SUMMARY OF THE INVENTION

This invention provides a trenched MOSFET (Metal-Oxide-Semiconductor Field Effect Transistor) with a trench termination comprising a substrate comprising a drain region which is strongly doped and a doping epi layer region, which is weekly doped the same type as the drain region, on the drain region; a plurality of source and body regions formed in the epi layer; a metal layer comprising a plurality of metal layer regions which are connected to respective source and body, and gate regions forming metal connections of the MOSFET; a plurality of metal contact plugs connected to respective metal layer regions; a plurality of gate trenches filled with polysilicon to form a plurality of trenched gates on top of epi layer; an insulating layer deposited on the epi layer formed underneath the metal layer with a plurality of metal contact holes therein for contacting respective source and body regions; a margin terminating gate trench which is around the gate trenches; and a margin terminating active region which is formed underneath the margin terminating gate trench.

Besides, a method for manufacturing the said trench MOSFET of the present invention comprising the steps, providing an epi layer on heavily doped substrate, forming a plurality of trenches in the epi layer, covering a gate oxide layer on the sidewalls and bottom of the trenches, forming a conductive layer in the trenches to be used as the gate of MOSFET, forming a plurality of channel regions and source regions according to active regions of the trench MOSFET in the epi layer, and a plurality of channel regions and source regions according to termination regions of the trench MOSFET in the epi layer; forming an insulating layer on the epi layer, forming a plurality of contact openings in the insulating layer and the source and body regions, and forming metal contact plugs in the contact openings to directly contact with both source and body regions, and a metal layer on the insulating layer.

The present invention has some advantages. One is feasible for high cell density with pitch smaller than 2.4 μm while the P body is formed after trench formation and no Boron segregation issue which is feasible for higher cell density (cell pitch is less than 2.4 μm) to reduce On-resistance and the P body is formed in termination area also without impacting breakdown voltage. Another is that no N+ near edge of active area and termination area to improve device ruggedness since these areas near by trench gate, and easily trigger on parasitic bipolars if there exists.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

The present invention is described by the following specific embodiments. Those with ordinary skills in the arts can readily understand the other advantages and functions of the present invention after reading the disclosure of this specification. The present invention can also be implemented with different embodiments. Various details described in this specification can be modified based on different viewpoints and applications without departing from the scope of the present invention.

Figure 2A:
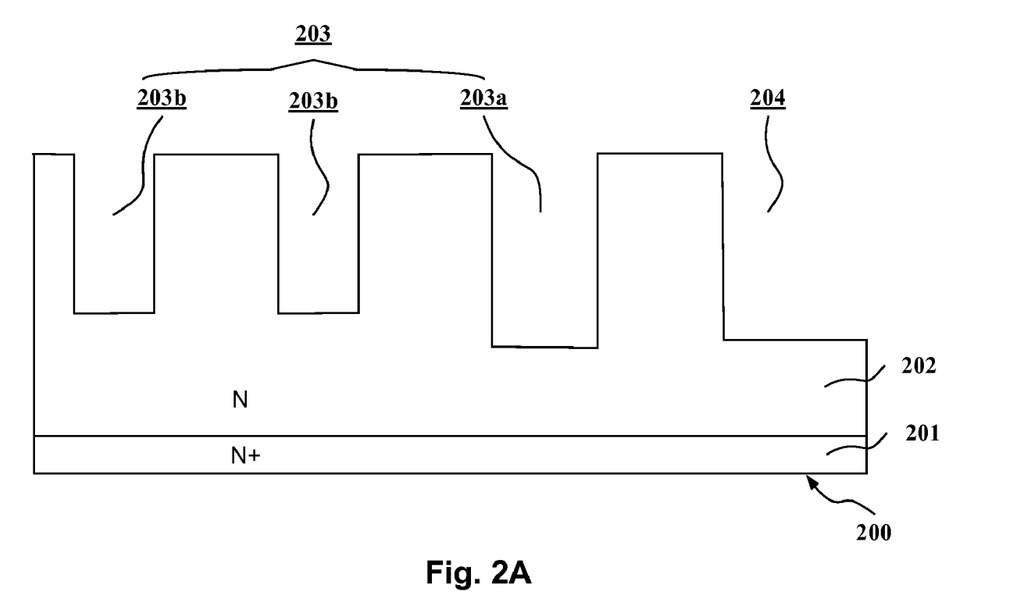
FIGS. 2A to 2E are cross-sectional diagrams illustrating forming a trench MOSFET with a trench termination in accordance with a first embodiment of the present invention.

Referring to FIG. 2A, a substrate 200 comprises a drain region 201 which is strongly n-doped, and the drain region 201 which is weekly n-doped haves a N-type doping epi layer region 202 thereon. A first mask is applied, and Lithography and dry etching processes are performed to form a plurality of gate trenches 203 and a margin terminating gate trench 204 in the N-type doping epi layer region 202. The trenches 203 comprise a first gate trench 203a and a second gate trench 203b, and the first gate trench 203a is deeper and wider than all the second gate trenches 203b. The margin terminating gate trench 204 is around the gate trenches 203.

Figure 2B:
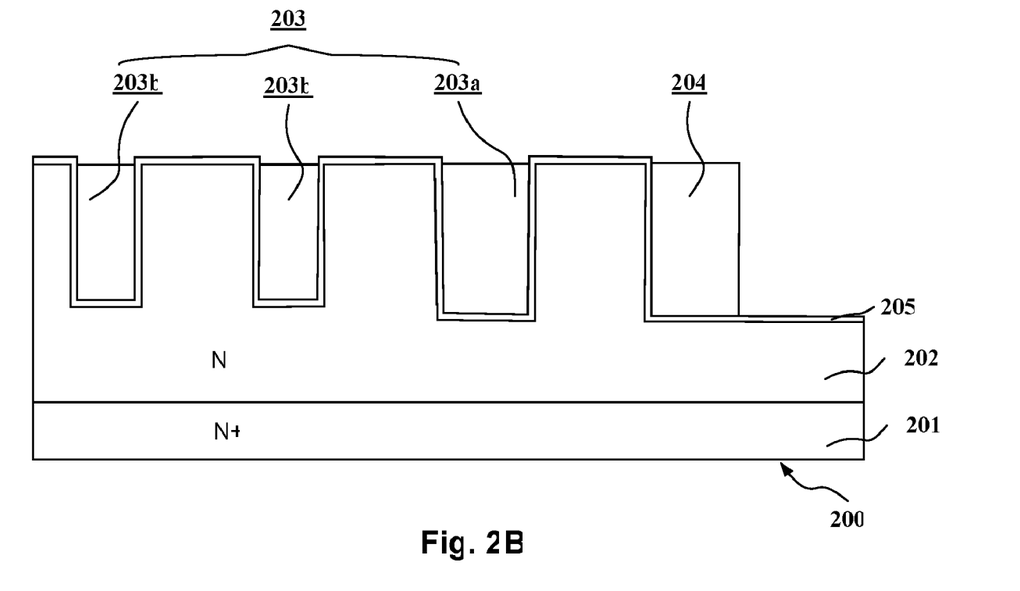

Referring to FIG. 2B, a deposition or thermally grown process is performed to form a silicon oxide layer on the surface of the N-type doping epi layer region 202, the gate trenches 203, and the margin terminating gate trench 204, which acts as a gate oxide layer 205 of a trenched MOSFET. Prior to the gate oxide layer 205 is formed, a sacrificial oxide is grown and wet etched for removal silicon damage along the gate trench 203 and the margin terminating gate trench 204 surface induced by the dry trench etch. Thereafter, a doped polysilicon layer is formed on the gate oxide layer 205 and filled in the gate trenches 203 and the margin terminating gate trench 204 by a deposition process. The doped polysilicon layer on the gate oxide layer 205 is flated by a dry etching process or a CMP (chemical-mechanical polishing process) and the doped polysilicon layer on the gate trenches 203 and the margin terminating gate trench 204 are removed by a polysilicon etching back process, and a plurality of gate structures of the trenched MOSFET in the trench are formed.

Figure 2C:
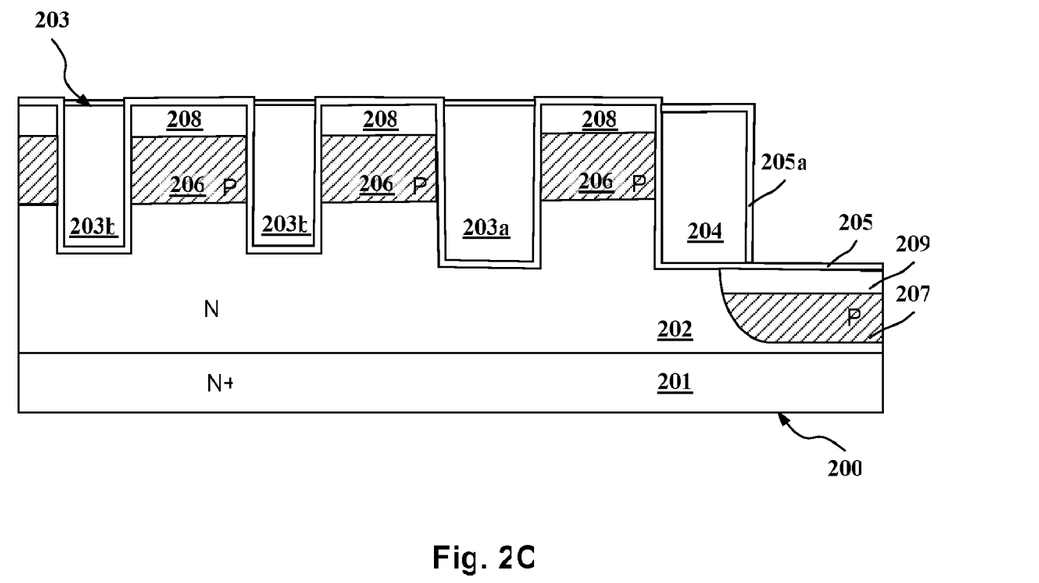

Referring to FIG. 2C, a plurality of channel regions 206 and a margin terminating channel region 207, which are p-doped layer, are formed in the N-type doping region 205 by an ion implantation and diffusion processes. The channel regions 206 are formed aside the gate trenches 203, and the margin terminating channel region 207 is formed underneath the margin terminating gate trench 204. Thereafter, a plurality of source region 208 and a margin terminating source region 209, which are strongly n-doped layer, are respectively formed in the channel regions 206 and the margin terminating channel region 207 by an ion implantation and thermal diffusion processes and the active regions of the trenched MOSFET are completed. Besides, a second gate oxide layer 205a is formed by a deposition or thermally grown process on the surface of the gate trenches 203 and the margin terminating gate trench 204.

Figure 2D:
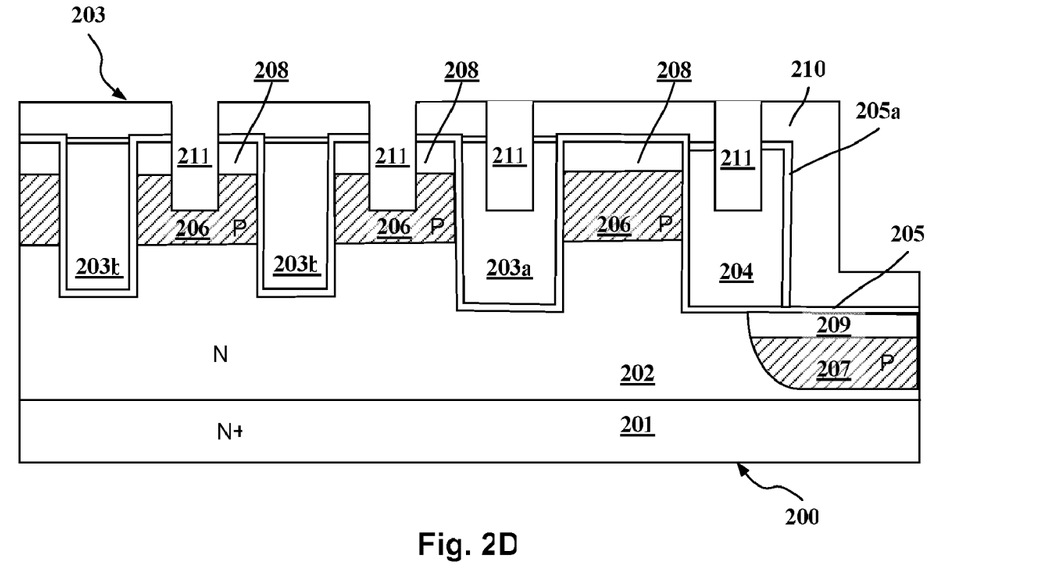

Referring to FIG. 2D, an insulating layer 210 is formed on the gate trench 203, the margin terminating gate trench 204, the gate oxide layer 205 and the second gate oxide layer 205a. This insulating layer 210 is a silicon dioxide layer formed by a deposition process. Then, a second mask is applied to defined a etching region, and a plurality of contact plug holes 211 are formed by a dry etching process and the contact plug holes 211 are located at the active regions, the first gate trench 203a and the margin terminating gate trench 204 corresponding to locations of metal contacts of the trenched MOSFET.

Figure 2E:
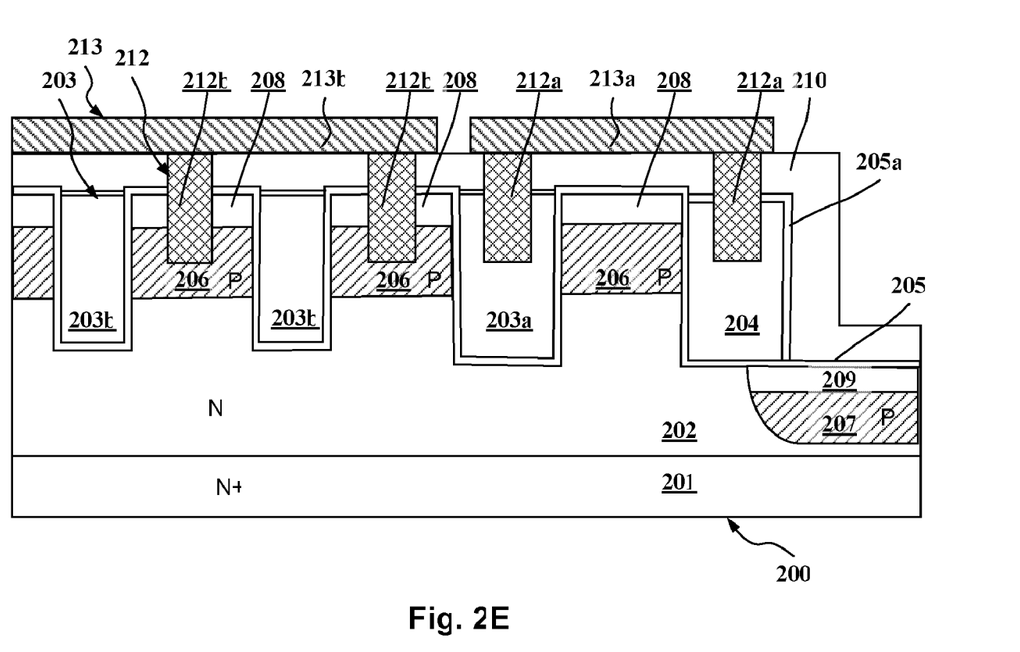

Referring to FIG. 2E, the contact plug holes 211 can be filled with tungsten metal to form a plurality of contact plugs 212 comprising a plurality of first contact plugs 212a which are corresponding to the active regions and a plurality of second contact plugs 212b which are corresponding to the first gate trench 203a and the margin terminating gate trench 204. Besides tungsten metal, aluminum metal or copper metal is used as the contact plug or the front metal layer of the trenched MOSFET. After etch back of the contact plugs 212, a third mask is applied to defined a region for metal connections of the trenched MOSFET. then, a metal layer 213, a metal layer Ti/Aluminum alloys, is deposited on the insulating layer 210 and the contact plugs 212, and the metal layer 213 comprises a first metal layer region 213a and a second metal layer region 213b which are separated and are metal connections of the trenched MOSFET. The first metal layer region 213a connects the first contact plugs 212a corresponding to the first gate trench 203a and the margin terminating gate trench 204, and the second metal layer region 213b connects the first contact plug 212a corresponding to the channel regions 206 and the source regions 208 which are defined the active regions of the trenched MOSFET.

Referring to FIG. 2E showed a first embodiment again, the trench MOSFET with a trench termination of the present invention has a MOSFET structure comprises the drain region 201, the N-type doping epi layer region 202, the gate trenches 203, the margin terminating gate trench 204, the gate oxide layer 205, the channel regions 206, the margin terminating channel region 207, the source regions 208, the margin terminating source region 209, the insulating layer 210, the contact plugs 212, and the metal layer 213. The metal layer 213 comprises the first metal layer region 213a and the second metal layer region 213b which are formed on the top of the MOSFET structure, and the first metal layer region 213b and the second metal layer region 213a are formed as the source metal, and the gate and field plate metal of the MOSFET, respectively. The gate trenches 203 comprises the first gate trench 203a and the second gate trench 203b which are covered the gate oxide layer 205 and are defined as the gate of the MOSFET. The insulating layer 210 is formed between the metal layer 213 and the gate trenches 203 for insulating, and the contact plugs 212 are penetrated through the insulating layer 210 and contacted with the metal layer 213. The margin terminating channel region 207 and the margin terminating source region 209 define an active region at the termination of the MOSFET structure, and the margin terminating gate trench 204, the margin terminating channel region 207, and margin terminating source region 209 avoid margin breakdown.

Although NMOS transistors are described in the first embodiment of the invention, it is obvious for those skilled in the same art can also refer to PMOS transistor, for an example, only the n-doped regions are substituted by p-doping and vice versa.

Figure 3:
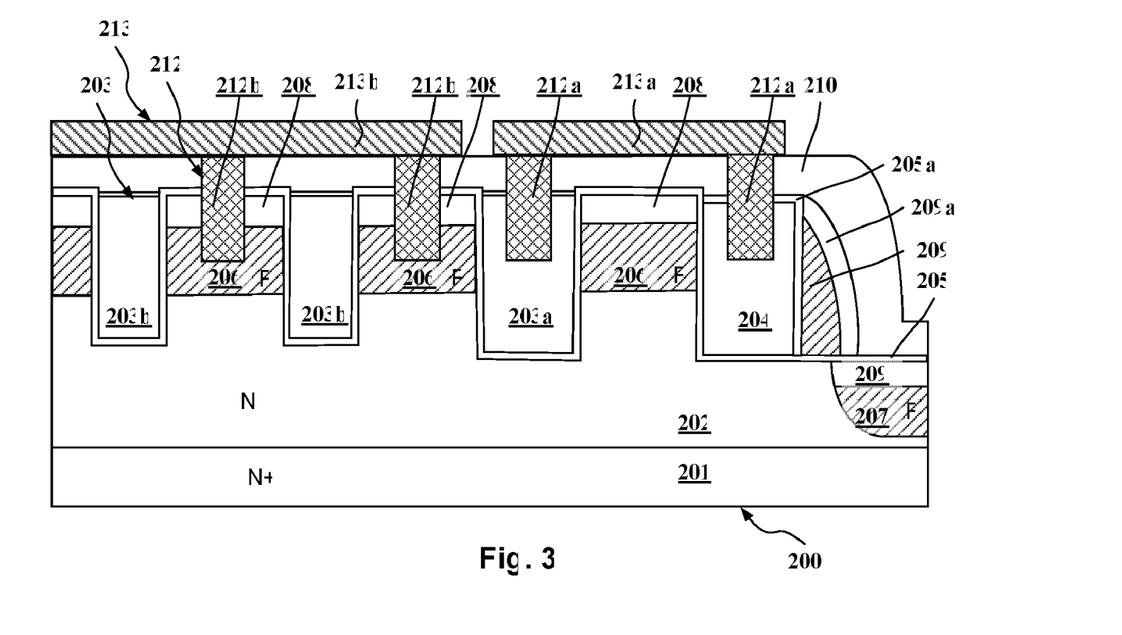
FIG. 3 is a cross-sectional diagram illustrating the trench MOSFET with a trench termination in accordance with a second embodiment of the present invention.

Referring to FIG. 3 showed a second embodiment, the P-doped regions of the trench MOSFET with a trench termination of the present invention can be alternatively formed by a deposition process so that a margin terminating sidewall channel region 207a is formed at a side of the margin terminating gate trench 204. Besides, a margin terminating sidewall source region 209a is also formed on the margin terminating sidewall channel region 207a during the source region process.

Figure 4:
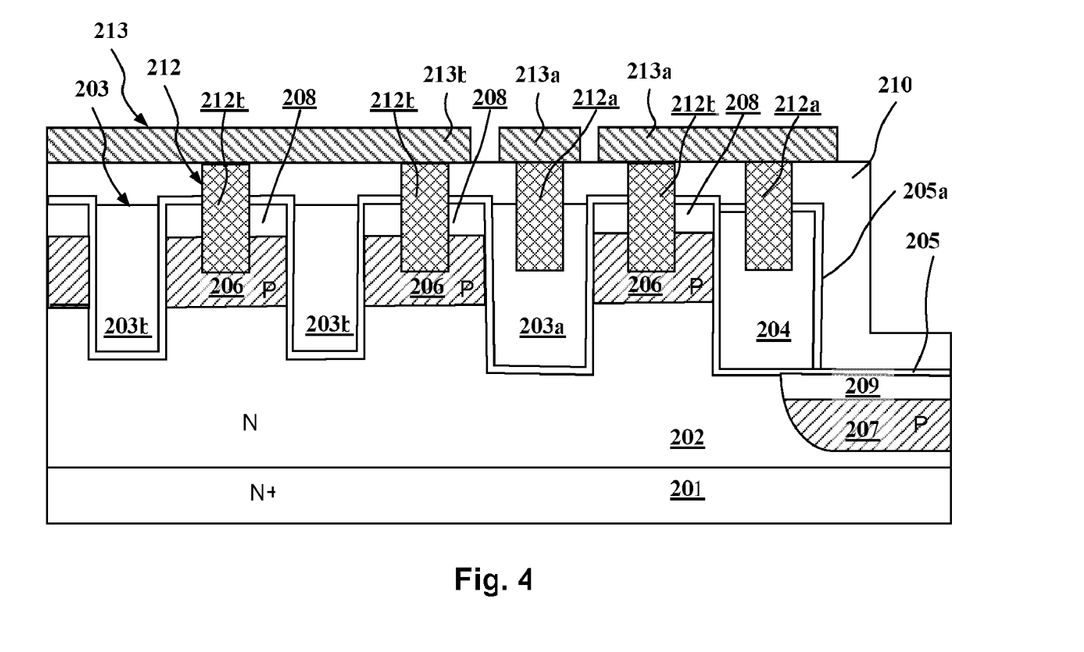
FIG. 4 is a cross-sectional diagram illustrating the trench MOSFET with a trench termination in accordance with a third embodiment of the present invention.

Referring to FIG. 4 showed a third embodiment, the trench MOSFET with a trench termination of the present invention is similar to the first embodiment of the present invention. The second metal layer region 213b is divided into two parts which are the gate runner and the field plate metal of the MOSFET respectively.

Figure 5:
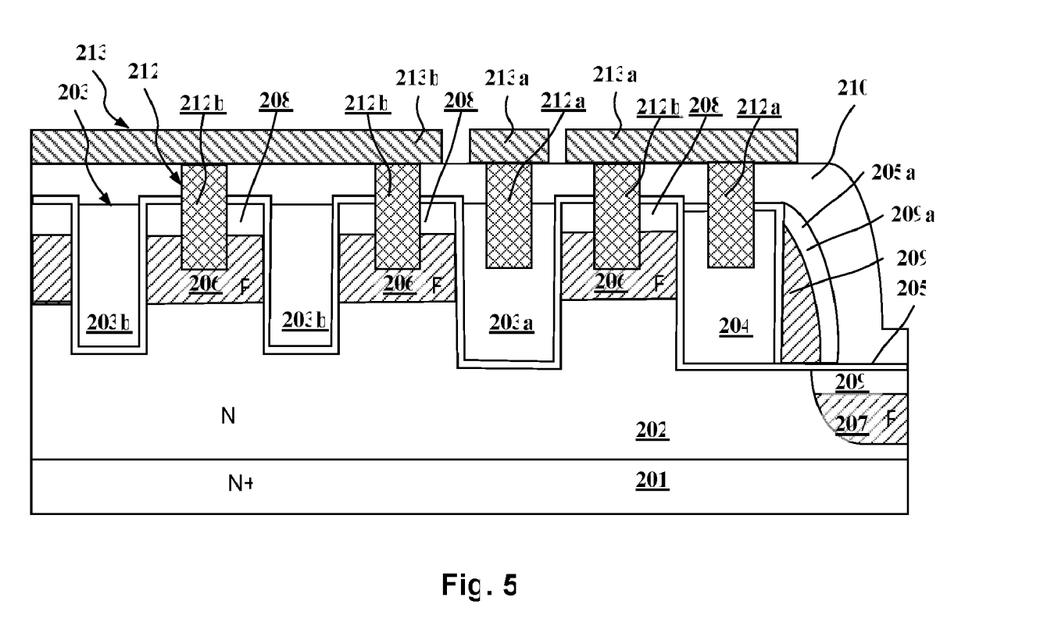
FIG. 5 is a cross-sectional diagram illustrating the trench MOSFET with a trench termination in accordance with a fourth embodiment of the present invention.

Referring to FIG. 5 showed a fourth embodiment, the trench MOSFET with a trench termination of the present invention is similar to the second embodiment of the present invention. The second metal layer region 213b is divided into two parts which are the gate runner and the field plate metal of the MOSFET respectively.

Although various embodiments are specifically illustrated and described herein, it will be appreciated that modifications and variations of the present invention are covered by the above teachings and are within the purview of the appended claims without departing from the spirit and intended scope of the invention.

What is claimed is:

1. A trenched MOSFET with a trench termination, comprising:
- a substrate comprising a drain region which is strongly doped and a doping epi layer region, which is weakly doped the same type as the drain region, on the drain region;
- a plurality of body regions with opposite type doping of said epi layer region served as channel regions disposed in said epi layer region;
- a plurality of source regions with same type doping as said drain region formed in said body regions;
- a metal layer comprising a plurality of metal layer regions which are connected to respective said source and body regions, and gate regions forming source metal and gate metal connections of the MOSFET;
- a plurality of metal contact plugs connected to respective said source and gate metals;
- a plurality of gate trenches filled with polysilicon to form a plurality of trenched gates in top portion of said epi layer;
- an insulating layer deposited on said epi layer formed underneath said metal layers with a plurality of metal contact holes therein for contacting respective said source and body regions;
- a margin terminating gate trench formed in a termination area;
- a margin terminating trench gate formed along trench sidewall of said margin termination trench;
- a first margin terminating doping region comprising source and body regions formed along one trench sidewall of said margin terminating trench gate; and
- a second margin terminating doping region comprising said source and body regions, formed underneath a portion of trench bottom of said margin terminating gate trench near by bottom of another trench sidewall of said margin terminating trench gate.

2. The trench MOSFET as claimed in claim 1, wherein said second margin terminating doping region has overlap with trench bottom of said margin terminating trench gate.

3. The trench MOSFET as claimed in claim 1, wherein said second margin terminating doping region does not have overlap with trench bottom of said margin terminating trench gate.

4. The trench MOSFET as claimed in claim 1, wherein said gate metal electrically connects with said margin terminating trench gate.

5. The trench MOSFET as claimed in claim 1, wherein said source metal electrically connects with said margin terminating trench gate.

* * * * *